(12) United States Patent
Purdy et al.

(10) Patent No.: US 7,695,986 B1
(45) Date of Patent: Apr. 13, 2010

(54) METHOD AND APPARATUS FOR MODIFYING PROCESS SELECTIVITIES BASED ON PROCESS STATE INFORMATION

(75) Inventors: Matthew A. Purdy, Austin, TX (US); Matthew Ryskoski, Kyle, TX (US); Richard J. Markle, Austin, TX (US)

(73) Assignee: GlobalFoundries, Inc., Grand Cayman (KY)

( * ) Notice: Subject to any disclaimer, the term of this patent is extended or adjusted under 35 U.S.C. 154(b) by 126 days.

(21) Appl. No.: 11/194,233

(22) Filed: Aug. 1, 2005

(51) Int. Cl.
*H01L 21/00* (2006.01)

(52) U.S. Cl. .............................. 438/9; 438/16; 438/738; 257/E21.528; 257/E21.53

(58) Field of Classification Search ................. 438/9, 438/16, 738; 257/E21.528, E21.53
See application file for complete search history.

(56) References Cited

U.S. PATENT DOCUMENTS 5,147,520 A * 9/1992 Bobbio .................. 204/192.33
6,368,975 B1 * 4/2002 Balasubramhanya et al. ......................... 438/706

OTHER PUBLICATIONS

Mike Clayton et al, Manufacturing Integration of Data Collection and Statistical Process Control Systems, 0/7803-4192-9/97, IEEE, 1997, pp. 505-507.*

* cited by examiner

*Primary Examiner*—Jarret J Stark
(74) *Attorney, Agent, or Firm*—Williams, Morgan & Amerson

(57) ABSTRACT

The present invention provides a method and apparatus for modifying process selectivities based on process state information. The method includes accessing process state information associated with at least one material removal process, determining at least one selectivity based on the process state information, and modifying at least one process parameter of said material removal process based on said at least one determined selectivity.

14 Claims, 4 Drawing Sheets

METHOD AND APPARATUS FOR MODIFYING PROCESS SELECTIVITIES BASED ON PROCESS STATE INFORMATION

BACKGROUND OF THE INVENTION

1. Field of the Invention

This invention relates generally to semiconductor fabrication, and, more particularly, to modifying process selectivities based on process state information.

2. Description of the Related Art

Chemical and/or mechanical techniques may be used to remove material from wafers during semiconductor processing. For example, etching techniques may be used to remove selected portions of one or more layers deposited above a substrate to form structures, such as gates, vias, trenches, and the like. For another example, chemical mechanical polishing techniques may be used to polish and/or planarize a surface of a layer deposited above the substrate. The rate at which the chemical and/or mechanical techniques remove material typically depends on parameters associated with the removal technique. For example, etching rates may depend on parameters such as the concentration and/or composition of the etchant, the ambient temperature and/or pressure, and the like. For another example, chemical mechanical polishing rates may depend on the concentration and/or pH of the slurry compound, a spin rate of a platen, and the like.

Material removal rates also depend upon the chemical composition of the material being removed. For example, an etching technique may remove silicon dioxide at a first rate and the same etching technique may remove silicon nitride at a second rate that is about 10 times slower than the first rate. The relative rate at which a given technique removes different materials is commonly referred to as the "selectivity" of the technique. For example, the selectivity of the etching technique described above to silicon dioxide and silicon nitride is about 10:1. Selecting an appropriate selectivity may substantially improve processing of a semiconductor wafer. For example, when a silicon dioxide layer is being etched, overetching of a silicon nitride layer that is formed beneath the silicon dioxide layer may be reduced by using an etchant that has a relatively large silicon-dioxide-to-silicon-nitride selectivity.

The selectivity of a material removal technique, such as etching or chemical mechanical polishing, is usually determined based on wafer state measurements. For example, a silicon dioxide layer may be deposited above a wafer and polished using a chemical mechanical polishing technique. Before and after thicknesses of the silicon dioxide layer may be determined using metrology and used to determine the silicon dioxide removal rate for the chemical mechanical polishing technique. A silicon nitride layer may be deposited above another wafer and polished using the same chemical mechanical polishing technique. Before and after thicknesses of the silicon nitride layer can be used to determine the silicon nitride removal rate for the chemical mechanical polishing technique. The silicon dioxide and silicon nitride removal rates may then be combined to determine the selectivity of the chemical mechanical polishing technique.

Conventional techniques for determining selectivities using wafer state measurements are time-consuming and reduce the throughput of the semiconductor fabrication facility. One method for improving the efficiency of conventional selectivity determination techniques uses process state sensors to identify process endpoints where selectivities are more likely to change. For example, optical emission spectroscopy may be used to detect an endpoint of an etching or chemical mechanical polishing process. Once the endpoint has been reached, the selectivity may be determined using the conventional multi-wafer process described above. However, these selectivity determination techniques may still reduce the throughput of the semiconductor fabrication facility.

The present invention is directed to addressing the effects of one or more of the problems set forth above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

In one embodiment of the instant invention, an apparatus is provided for modifying process selectivities based on process state information. The apparatus includes at least one processing tool for removing material and a selectivity unit for accessing process state information associated with at least one material removal process performed by said at least one processing tool and determining at least one selectivity based on the process state information. The apparatus also includes a control unit for modifying at least one process parameter of said material removal process based on said at least one determined selectivity.

In another embodiment of the present invention, a method is provided for modifying process selectivities based on process state information. The method includes accessing process state information associated with at least one material removal process, determining at least one selectivity based on the process state information, and modifying at least one process parameter of said material removal process based on said at least one determined selectivity.

BRIEF DESCRIPTION OF THE DRAWINGS

The invention may be understood by reference to the following description taken in conjunction with the accompanying drawings, in which like reference numerals identify like elements, and in which.

Figure 1:
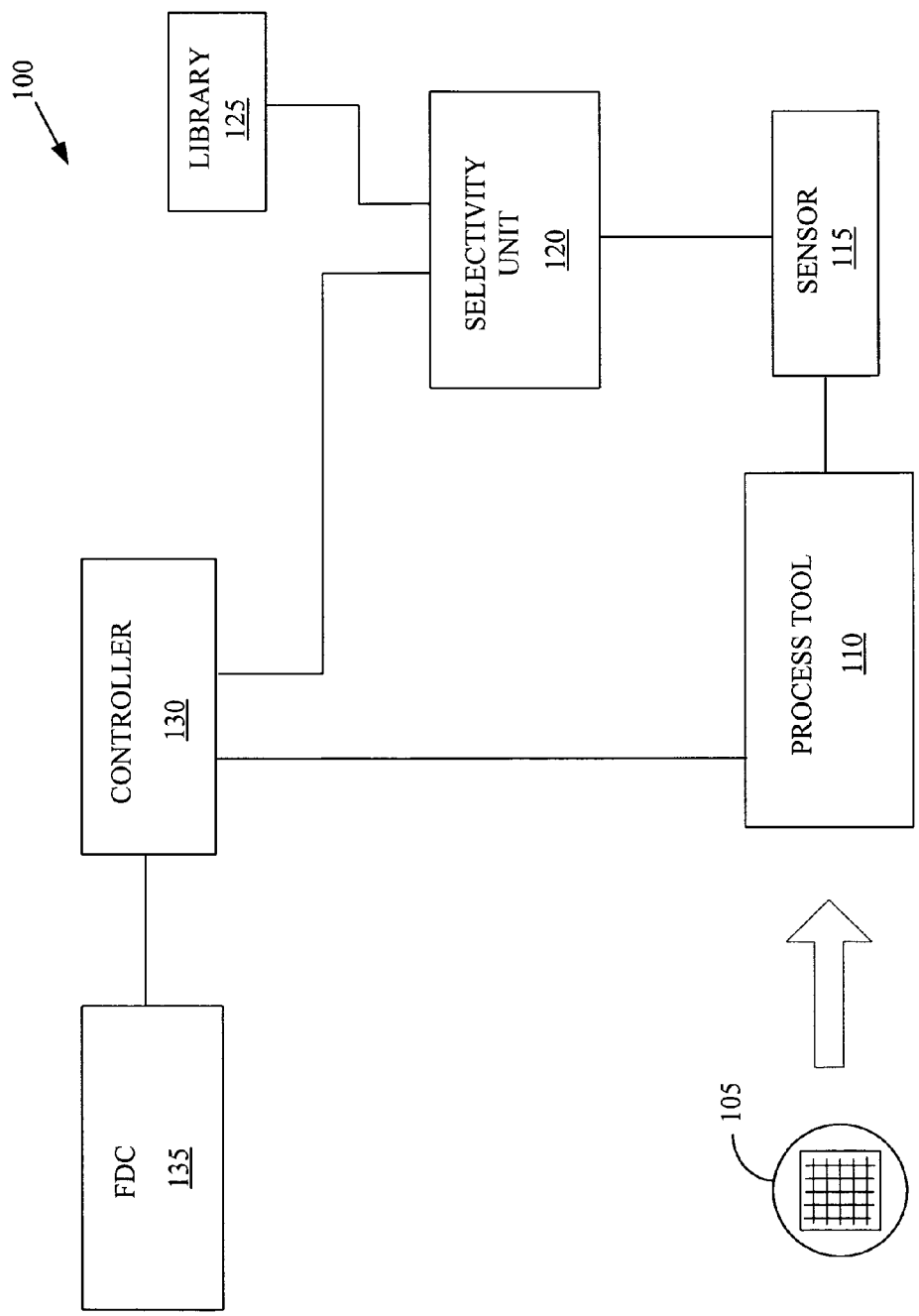
FIG. 1 conceptually illustrates one exemplary embodiment of a semiconductor fabrication system, in accordance with the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions should be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Portions of the present invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Note also that the software implemented aspects of the invention are typically encoded on some form of program storage medium or implemented over some type of transmission medium. The program storage medium may be magnetic (e.g., a floppy disk or a hard drive) or optical (e.g., a compact disk read only memory, or "CD ROM"), and may be read only or random access. Similarly, the transmission medium may be twisted wire pairs, coaxial cable, optical fiber, or some other suitable transmission medium known to the art. The invention is not limited by these aspects of any given implementation.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

FIG. 1 conceptually illustrates one exemplary embodiment of a semiconductor fabrication system 100. In the illustrated embodiment, a wafer 105 may be provided to a process tool 110, which may perform one or more material removal processes. Although a single wafer 105 is shown in FIG. 1, persons of ordinary skill in the art having benefit of the present disclosure should appreciate that the wafer 105 may also be representative of a plurality of wafers, wafer lots, and/or other workpieces. Exemplary material removal processes include, but are not limited to etching, polishing, planarization, and the like. The processing tool 110 may also perform other processing related to material removal, such as depositing material layers, forming a patterned mask, and the like. However, persons of ordinary skill in the art should appreciate that, in alternative embodiments, the process tool 110 may also perform processing not related to material removal. Furthermore, although FIG. 1 shows a semiconductor fabrication system 100, persons of ordinary skill in the art should appreciate that the present invention may also be applied in other manufacturing environments and/or to other types of the workpieces.

Figure 2:
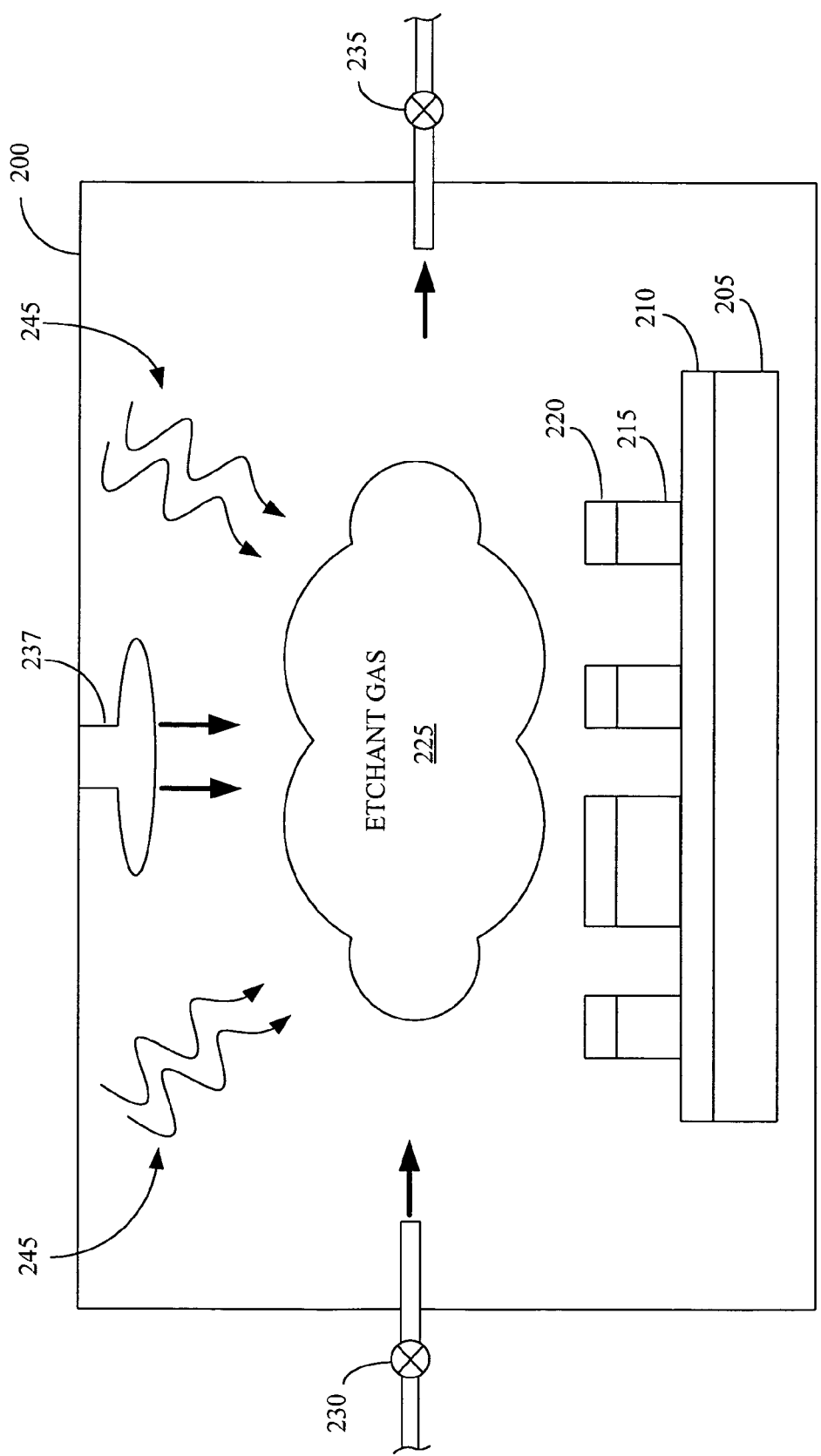
FIG. 2 conceptually illustrates one exemplary embodiment of an etching tool that may be included in the process tool shown in FIG. 1, in accordance with the present invention.

FIG. 2 conceptually illustrates one exemplary embodiment of an etching tool 200 that may be included in the process tool 110 shown in FIG. 1. In the illustrated embodiment, a wafer 205 is positioned in the etching tool 200. A layer 210 formed of a first material, such as silicon nitride, has been formed above the wafer 205 and a patterned layer 215 formed of a second material, such as silicon dioxide, as the formed above the layer 210. A patterned masking layer 220, e.g., photoresist, has been formed above the patterned layer 215. Persons of ordinary skill in the art should appreciate that the layers 210, 215, 220, as well as the materials used to form them, are intended to be illustrative and not to limit the present invention.

The etching tool 200 is used to etch portions of a patterned layer 215 through the pattern masking layer 220. Accordingly, the etching tool 200 may use an etching technique that has a selectivity such that the material used to form the patterned layer 215 is etched at a higher rate than the material used to form the masking layer 220. The etching technique may also have a selectivity such that the material used to form the patterned layer 215 is etched at a higher rate than the material used to form the layer 210. For example, the etching technique may have a selectivity of approximately 10:1 for etching silicon dioxide and silicon nitride, respectively.

In the illustrated embodiment, etching of the patterned layer 215 is performed by exposing the wafer 205 to an etchant gas 225. For example, the etchant gas 225 may include $H_xC_4$ or any other desirable chemical species. The etchant gas 225 may be provided through one or more inlet valves 230 at a selected flow rate and may be removed from the etching tool 200 at a selected exhaust rate using one or more outlet valves 235. The etchant gas 225 may also be provided using a shower head gas diffuser 237. Radio frequency power 245 may also be applied to generate a plasma within the tool 200. The etching rate and/or selectivity of the etchant gas 225 may depend on the physical and/or chemical state of the etchant gas 225, which may be varied by changing one or more of the processing tool parameters, such as the flow rate, the exhaust rate, the radio frequency power, the pressure, the temperature, and the like. For example, changing one or more of the processing tool parameters may alter a gas temperature and/or pressure, a concentration of one or more chemical species in the etchant gas 225, an abundance of one or more chemical species in the etchant gas 225, and the like.

Figure 3:
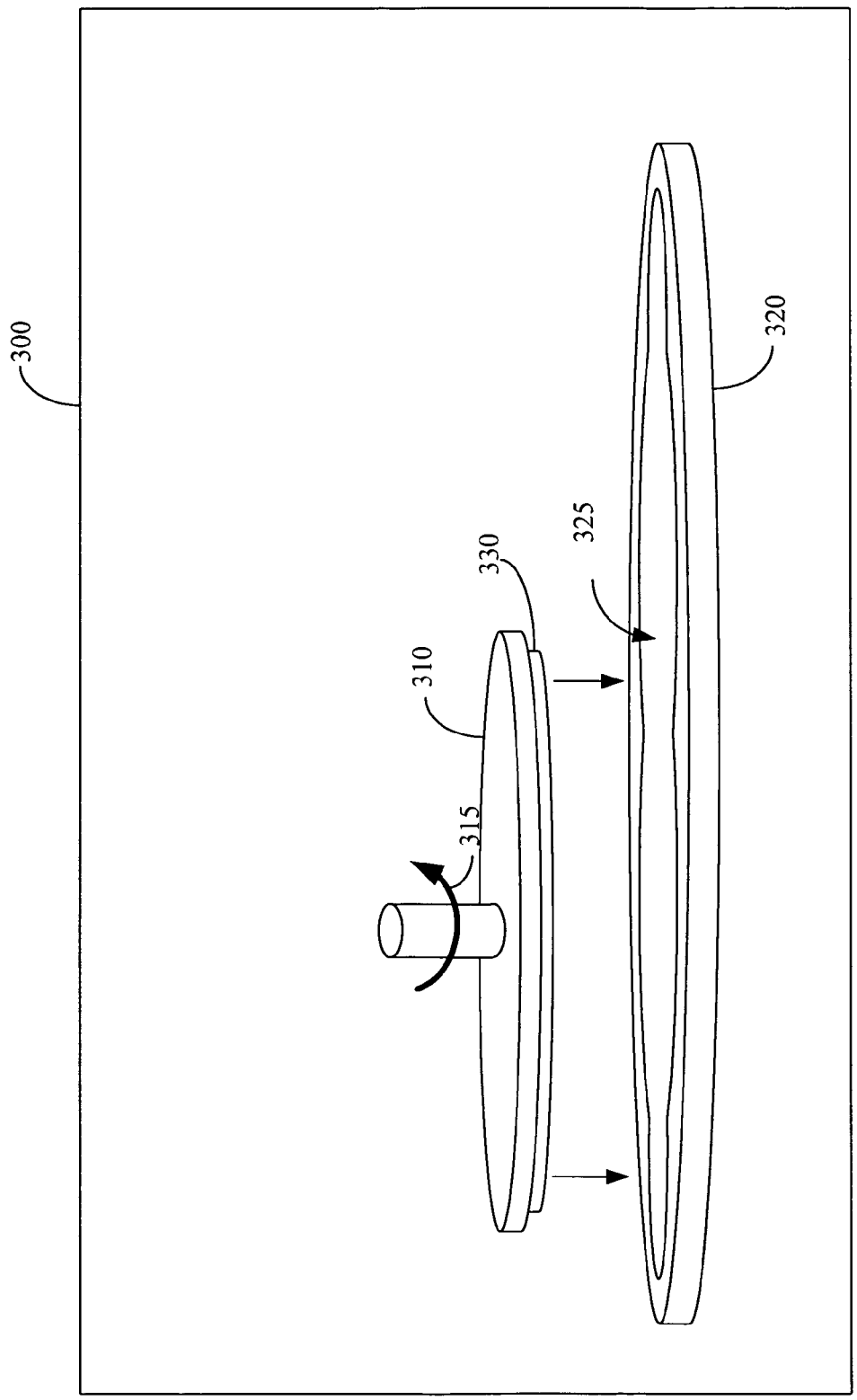
FIG. 3 conceptually illustrates one exemplary embodiment of a chemical mechanical polishing tool that may be included in the process tool shown in FIG. 1, in accordance with the present invention.

FIG. 3 conceptually illustrates one exemplary embodiment of a chemical mechanical polishing tool 300 that may be included in the process tool 110 shown in FIG. 1. In the illustrated embodiment, the chemical mechanical polishing tool 300 includes a rotatable polishing head 310, which may be rotated at a selected spin rate, as indicated by arrow 315. The chemical mechanical polishing tool 300 also includes a polishing pad 320. A slurry compound 325, which may include a selected concentration of $NH_4OH$, may be deposited on the polishing pad 320. A wafer 330 is mounted on the rotatable polishing head 310 in the chemical mechanical polishing tool 300. The wafer 330 includes a layer (not shown) formed of a first material, such as silicon nitride, and a layer (not shown) formed of a second material, such as silicon dioxide. Persons of ordinary skill in the art should appreciate that the number of layers on the wafer 330, as well as the materials used to form them, are intended to be illustrative and not to limit the present invention. Persons of ordinary skill in the art should also appreciate that other polishing devices, such as a rotating belt, may be used in place of the rotating polishing head 310 and polishing pad 320.

In operation, material may be removed from an exposed surface of the wafer 330 by providing relative rotation or movement between the polishing head 310 and the pad 320 to bring the wafer 330 in contact with the polishing slurry 325 and the pad 320 at a selected pressure. The polishing head 310 may then be spun at a selected spin rate to polish and/or planarize portions of the wafer 330. The material removal rate and/or selectivity of the chemical mechanical polishing tool 300 may depend on processing tool parameters such as the pressure applied to the wafer 330, the spin rate, and the like. The material removal rate and/or selectivity of the chemical mechanical polishing tool 300 may also depend on the physical and/or chemical state of the slurry 325, which may be varied by changing one or more of the processing tool parameters.

Referring back to FIG. 1, a sensor 115 is coupled to the process tool 110. Persons of ordinary skill in the art having benefit of the present disclosure should appreciate that the sensor 115 may be coupled to the process tool 110 in any desirable fashion. For example, the sensor 115 may be coupled to the process tool using a window that permits light to pass from the process tool 110 to the sensor 115. For another example, the sensor 115 may include one or more sensing devices (not shown) deployed within the processing tool 110 that are electrically coupled to the sensor 115 so that signals may be transmitted between the sensing devices and the sensor 115. Alternatively, the sensor 115 may be integrated into the process tool 110.

The sensor 115 includes one or more devices that may be used to monitor the physical and/or chemical state within the process tool 110. In one embodiment, the sensor 115 includes an optical emission spectroscopy device that may be used to detect the presence and/or intensity of emission lines produced by chemical species within a process tool 110. The presence and/or intensity of the emission lines may be indicative of the presence and/or absence of the chemical species within the process tool 110. In another embodiment, the sensor 115 includes a residual gas analyzer or a mass spectrometer, which may be used to analyze gas samples extracted from the process tool 110. The residual gas analyzer or mass spectrometer ionizes portions of the gas sample and uses spectral data from the ionized gas to determine a mass-to-charge ratio for chemical species in the gas. In yet another embodiment, the sensor 115 includes a Fourier transform infrared device that may be used to determine the presence and/or absence of chemical species in gases, liquids, and/or solids that may be present in the process to 110.

The sensor 115 may form, store, and/or provide process state information based on the physical and/or chemical state within the process tool 110. As used herein, the phrase "process state information" refers to information indicative of the physical and/or chemical state in the processing tool 110. In various alternative embodiments, process state information includes information indicative of a chemistry associated with an etching process, a polishing process, a chemical bath, and the like. For example, the process state information may include information indicative of abundances, concentrations, electron densities, pHs, and/or mass-to-charge ratios associated with chemical species used in the etching process, the polishing process, and/or the chemical bath. For another example, the process state information may include information indicative of one or more radio frequency powers, spin speeds, pressures, and/or temperatures. Process state information may be determined using data collected by a variety of well-known measurement devices including, but not limited to, a gas flow sensor, a temperature measurement device, a pressure measurement device, a pH sensor, and a Langmuir probe, as well as the optical emission spectroscopy device, the residual gas analyzer, the mass spectrometer, and the Fourier transform infrared device discussed above.

The selectivity unit 120 can access the process state information provided by the sensor 115. In one embodiment, the selectivity unit 120 accesses the process state information directly from the sensor 115. However, persons of ordinary skill in the art should appreciate that the present invention is not so limited. In alternative embodiments, the selectivity unit 120 may access the process state information from any desirable location including memory units in the system 100. The selectivity unit 120 may determine a selectivity associated with one or more material removal processes carried out by the process tool 110 using the accessed process state information. For example, the selectivity unit 120 may determine that an etching process has a selectivity of 10:1 for silicon dioxide and silicon nitride, respectively. In one embodiment, the selectivity unit 120 determines the selectivity using a correlation between the selectivity and the process state information. The correlation may be determined using a theoretical model of the process. Alternatively, the correlation may be determined empirically. In one embodiment, information indicative of the correlation between the selectivity and the process state information may be stored in a library 125, which may be accessed by the selectivity unit 120.

A controller 130 is communicatively coupled to the selectivity unit 120 and the process tool 110. The controller 130 uses the selectivity determined by the selectivity unit 120 to modify material removal process parameters used by the process tool 110. In one embodiment, the controller 130 modifies the material removal process parameters to attempt to maintain a nominal or target selectivity. For example, the controller 130 may modify one or more etching and/or chemical mechanical polishing parameters in order to maintain an etching and/or polishing selectivity, respectively, at a nominal or target value. Alternatively, the controller 130 may determine a new target value for the selectivity and may then modify one or more material removal process parameters to achieve the target value of the selectivity. In various alternative embodiment the controller 130 may include, or be a part of, an advanced process controller and/or a run-to-run controller.

The illustrated embodiment of the semiconductor fabrication system 100 includes a fault detection and control (FDC) unit 135. Techniques for the operation of the fault detection and control unit 135 are known to persons of ordinary skill in the art and so only those aspects relevant to the present invention will be discussed herein. The controller 130 may provide a signal to default detection and control unit 135 based on the selectivity determined by the selectivity unit 120. For example, the controller 130 may compare the selectivity to an alarm condition selectivity. If the selectivity is outside the bounds indicated by the alarm condition selectivity, then the controller may provide a signal to the fault detection and control unit 135 indicating an alarm condition. Persons of ordinary skill in the art having benefit of the present disclosure should appreciate that the fault detection and control unit 135 is an optional portion and not necessary to the practice of the present invention.

Figure 4:
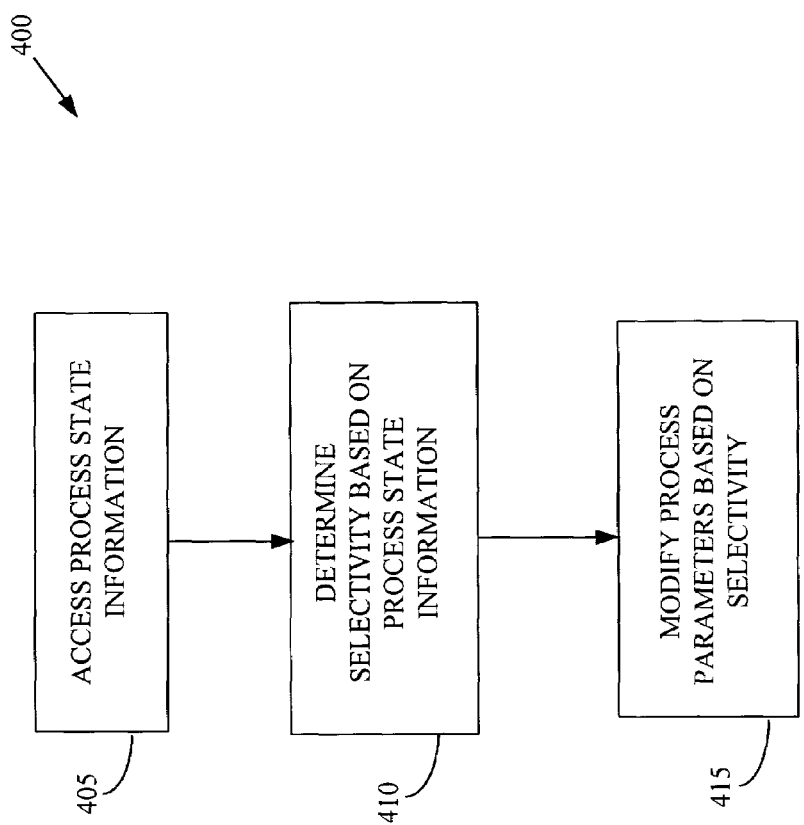
FIG. 4 conceptually illustrates one exemplary embodiment of a method of modifying process selectivities based upon process state information, in accordance with the present invention.

FIG. 4 conceptually illustrates one exemplary embodiment of a method 400 of modifying process selectivities based upon process state information. In the illustrated embodiment, process state information associated with a material removal process is accessed (at 405). The process state information may then be used to determine (at 410) one or more selectivities associated with the material removal process. One or more material removal process parameters are then modified (at 415) based on one or more selectivities determined (at 410). By modifying (at 415) the one or more material removal process parameters, the selectivity of the associated material removal process may be controlled, e.g., by an advanced process control system and/or a run-to-run controller.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method of controlling a processing tool in a semiconductor fabrication system, comprising:
    forming a first layer above a substrate, the first layer being formed of a first material;
    forming a second layer above the first layer, the second layer being formed of a second material and comprising at least one opening that exposes at least one portion of the first layer;
    accessing process state information associated with at least one material removal process performed in the processing tool, the process state information indicating at least one of a chemical state or a physical state of the processing tool when the processing tool is configured to perform said at least one material removal process in accordance with at least one process parameter;
    determining at least one selectivity of said at least one material removal process based on the process state information, said at least one selectivity indicating a difference between first and second rates of material removal for the first and second materials when said at least one material removal process is performed;
    modifying said at least one process parameter of said material removal process based on said at least one determined selectivity; and
    performing said material removal process according to said at least one modified process parameter to selectively remove portions of the first layer that are exposed by said at least one opening in the second layer.

2. The method of claim 1, wherein accessing the process state information comprises accessing process state information provided by at least one of optical emission spectroscopy, a residual gas analyzer, a mass spectrometer, a gas flow sensor, a pressure sensor, a temperature sensor, a pH sensor, a Langmuir probe, and a Fourier transform infrared device.

3. The method of claim 1, wherein accessing the process state information comprises accessing information indicative of the presence or intensity of at least one emission line.

4. The method of claim 1, wherein accessing the process state information comprises accessing information indicative of at least one of a pressure, a temperature, a pH, an electron density, presence or absence of a chemical species, an abundance of a chemical species, a concentration of the chemical species, and a mass-to-charge ratio of a chemical species.

5. The method of claim 1, wherein determining said at least one selectivity based on the process state information comprises determining said at least one selectivity using a correlation between selectivity and the process state information.

6. The method of claim 5, wherein determining said at least one selectivity using the correlation comprises determining said at least one selectivity using at least one of an empirically determined correlation and a theoretical correlation.

7. The method of claim 5, wherein determining said at least one selectivity using the correlation comprises accessing a library containing information indicative of a correlation between the selectivity and the process state information.

8. The method of claim 1, wherein modifying said at least one process parameter comprises:
    comparing the determined selectivity to a nominal selectivity; and
    modifying said at least one of material removal process parameter based on the comparison.

9. The method of claim 1, wherein modifying said at least one process parameter comprises:
    determining a target selectivity such that substantially all of the exposed portions of the first layer are removed before substantially all of the second layer is removed;
    comparing the determined selectivity to the target selectivity; and
    modifying said at least one material removal process parameter based on the comparison.

10. The method of claim 1, wherein modifying said at least one process parameter comprises modifying at least one of a process temperature, a process pressure, a spin speed, a gas flow rate, an exhaust rate, a radiofrequency power, a slurry concentration, a slurry pH, a concentration of a chemical species, and a process duration.

11. The method of claim 1, wherein modifying said at least one process parameter comprises modifying at least one process recipe.

12. The method of claim 1, wherein modifying said at least one process parameter comprises modifying at least one etching process parameter or at least one chemical mechanical polishing process parameter.

13. The method of claim 1, further comprising providing a signal to a fault detection and classification system based on the determined selectivity.

14. An apparatus, comprising:
   means for forming a first layer above a substrate, the first layer being formed of a first material;
   means for forming a second layer above the first layer, the second layer being formed of a second material and comprising at least one opening that exposes at least one portion of the first layer;
   means for accessing process state information associated with at least one material removal process performed in the processing tool, the process state information indicating at least one of a chemical state or a physical state of the processing tool when the processing tool is configured to perform said at least one material removal process in accordance with at least one process parameter;
   means for determining at least one selectivity based on the process state information, said at least one selectivity indicating a difference between a first and second rates of material removal when said at least one material removal process is performed;
   means for modifying said at least one process parameter of said material removal process based on said at least one determined selectivity; and
   means for performing said material removal process according to said at least one modified process parameter to selectively remove portions of the first layer that are exposed by said at least one opening in the second layer.

* * * * *